United States Patent [19]

Bolgiano

[11] 4,081,130
[45] Mar. 28, 1978

[54] FILTER-TYPE PULSE DETECTION MEANS

[75] Inventor: Duane Ridgely Bolgiano, Bala Cynwyd, Pa.

[73] Assignee: International Mobile Machines Corporation, Philadelphia, Pa.

[21] Appl. No.: 715,065

[22] Filed: Aug. 17, 1976

Related U.S. Application Data

[63] Continuation-in-part of Ser. No. 626,021, Oct. 28, 1975, Pat. No. 4,006,316, which is a continuation-in-part of Ser. No. 496,450, Aug. 12, 1974, Pat. No. 3,936,617.

[51] Int. Cl.$^2$ ............... H03K 21/06; G01R 23/02
[52] U.S. Cl. ............... 235/92 PB; 235/92 FQ; 235/92 TE; 235/92 R; 328/109
[58] Field of Search ......... 235/92 PE, 92 PB, 92 FQ, 235/92 TE; 179/2 A, 84 VF; 328/108, 109; 324/78 D

[56] References Cited

U.S. PATENT DOCUMENTS

| | | | |
|---|---|---|---|
| 3,790,720 | 2/1974 | Schartmann | 235/92 PB |
| 3,860,798 | 1/1975 | Kemper | 235/92 PB |
| 3,917,927 | 11/1975 | Minton | 235/92 FQ |
| 3,936,603 | 2/1976 | Guppy et al. | 235/92 PB |
| 3,981,440 | 9/1976 | Richardson | 235/92 FQ |

*Primary Examiner*—Joseph M. Thesz
*Attorney, Agent, or Firm*—Arthur A. Jacobs

[57] ABSTRACT

A filter-type pulse counter system which separates pulses of desired frequencies from pulses of undesired frequencies, filters out the pulses of undesired frequencies, and then accepts and counts only those pulses of the desired frequencies.

6 Claims, 1 Drawing Figure

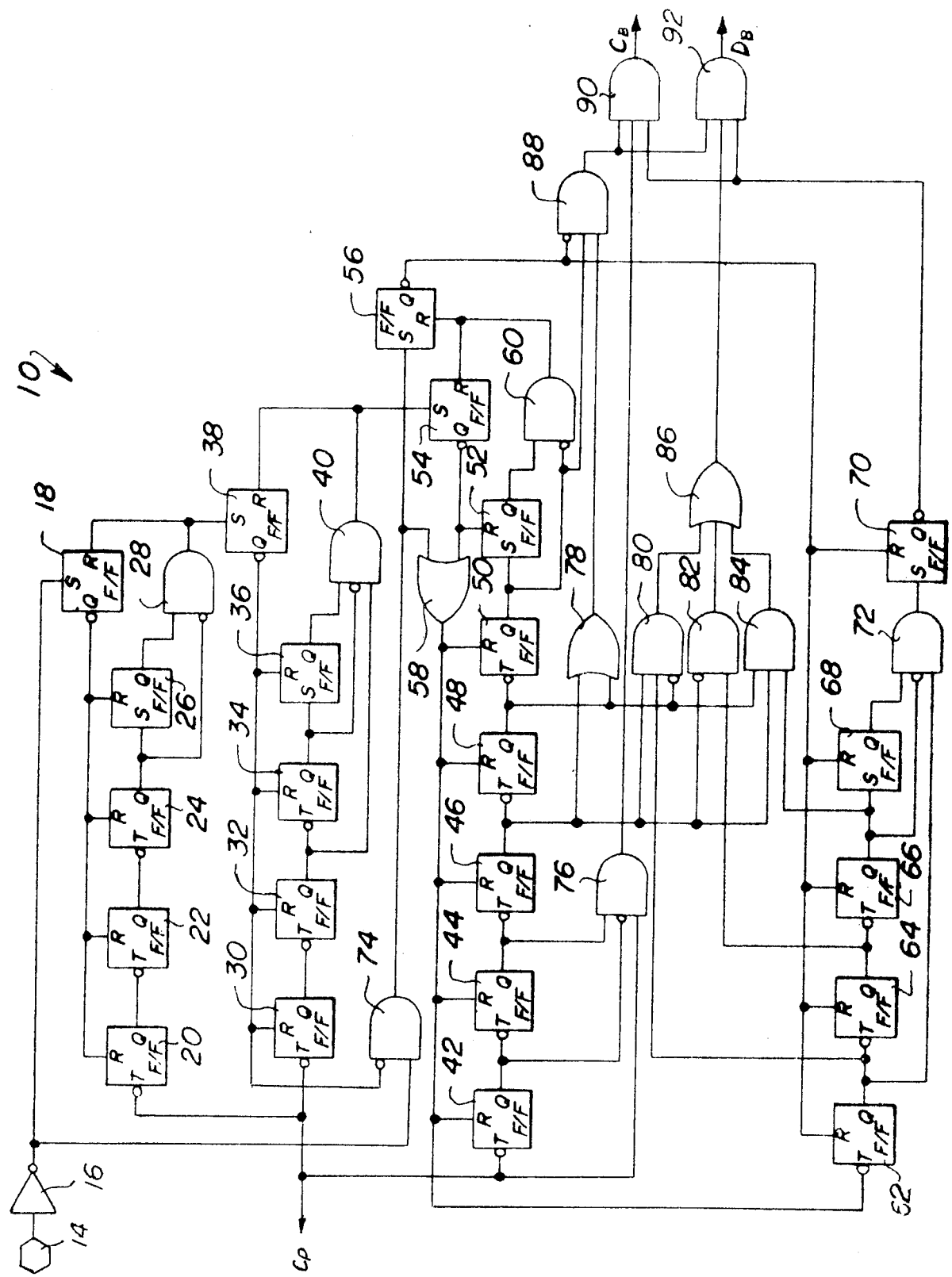

FILTER-TYPE PULSE DETECTION MEANS

This is a continuation-in-part of application Ser. No. 626,021, filed Oct. 28, 1975 now issued as U.S. Pat. No. 4,006,316 which is, in turn, a continuation-in-part of application Ser. No. 496,450, filed Aug. 12, 1974 now issued as U.S. Pat. No. 3,936,617.

In the parent application Ser. No. 626,021, a pulse detector means was described in detail wherein this detector means was used to detect dial pulses in a telephone system or the like, these pulses being used as part of a telephone network which screens out undesired telephone calls and remotely controls various functions by means of the telephone network.

It has now been found that this pulse detector means may equally as well be utilized with other systems such as radar networks, patient monitoring systems to monitor vital signs, juke boxes, programed machinery, and the like. In this respect, it is applicable to almost any type pulses, in addition to those generated by a telephone dial, and can be utilized for a variety of purposes where it is desired to filter out and count particular pulses occurring at a predetermined rate. Such a pulse detector absorbs both desired pulses and undesired pulses such as correspond to noise, filters out the noise, and provides a binary count of the desired pulses.

It is, therefore, an object of the present invention to provide a filter-type pulse counter which is utilizable in a variety of systems and for a variety of functions.

Another object of the present invention is to provide a filter-type pulse counter which is relatively simple but highly efficient.

Other objects and many of the attendant advantages of this invention will be readily appreciated as the same becomes better understood by reference to the following description when read in conjunction with the accompanying drawings wherein:

The single FIGURE is a schematic view of a pulse detector system embodying the present invention.

Referring in greater detail to the drawing, the system, generally indicated at 10, comprises a terminal 14 connected to the output of any desired pulse transmitter (not shown), although, for exemplification, these pulses will be considered, in the present instance, as being generated by a telephone dial. Clock pulses, indicated at $C_p$, are generated by a source of 120 Hz pulses which may be derived from a 60 Hz power line by any method of frequency doubling, as, for example, by means of a full-wave rectifier.

The pulses from terminal 14 are applied through an amplifier 16 to a flip-flop 18 which, in combination with a set of series connected flip-flops 20, 22, 24 and 26, and an AND gate 28, comprises a first counter. A second counter comprises flip-flops 30, 32, 34, 36 and 38 plus an AND gate 40. A third counter comprises flip-flops 42, 44, 46, 48, 50, 52, 54 and 56 plus OR gate 58 and AND gate 60. A fourth comprises flip-flops 62, 64, 66, 68 and 70 plus AND gate 72. An AND gate 74 serves as an acceptance gate, while output decoding is accomplished by AND gates 76, 78, 80, 82 and 84 plus OR gate 86, AND gates 88, 90 and 92. Gate 76 produces clock pulses while gates 80, 82, 84 and 86 produce data levels which are respectively inhibited by gates 90 and 92. Both gates 90 and 92 are controlled by gate 88.

The detector detects one digit at a time, immediately producing three bits representing the digit at the conclusion of detection. The first two counters act as a filter so that only dial pulses of a proper frequency will be detected. The first pulse is always lost, whereby inadvertant or random noise pulses are not detected as dial pulses. The first three counters may be considered as being the digital equivalent of analog monostables. In other words, when triggered, an output of fixed, predetermined duration is produced. The output of the first counter triggers the second counter. The output of the second counter enables the acceptance gate, 74, so that if the output of the second counter is false, then a dial pulse is passed through gate 74. If the pulses are at the wrong speed, or come at improper timing intervals, they will not be passed through the acceptance gate. The passage of the first accepted pulse (in other words, the second dial pulse) starts the third counter. However, each time a dial pulse is accepted by gate 74, the third counter is reset to "0", thus making it start its count all over again. The second and third counters, like the first counter, also count clock pulses. In addition, each accepted dial pulse is counted by the fourth counter.

At the conclusion of the last dial pulse, the third counter is no longer reset to "0" by any succeeding pulses, and so can count to its conclusion. The last 12 counts of the third counter are used to operate the output conversion circuits. Clock pulses are derived from the third counter and occur regularly for every fourth $C_p$ pulse, after the conclusion of the last dial pulse. Gate 88 is true during the last 12 clock pulses of the third counter's count and enables the last 3 clock pulses from gate 76 to be passed onward to the input processor on line $C_B$. Simultaneously, the third counter causes the data gates to sequentially sample the status of the flip-flops in the fourth counter, producing the data levels, which, like the clock pulses, are gated by the level of gate 88 to produce a data output on line $D_B$. The clock pulses occur just past the middle of the data pulse, so that there are no inherent race conditions.

Since the acceptance gate, 74, is enabled by the second counter, a filter is formed whereby only dial pulses will be accepted where the duration between the start of each pulse lies between predetermined limits. This is equivalent to saying that dial pulses at speeds between such limits will always be accepted, whereas pulses at speeds slower or faster than said limits will never be accepted. A predetermined time after the beginning of the last dial pulse, gate 88 is operated to pass the number out of the decoder.

The functioning of the decoder described above is as follows: A dial pulse enters at 14 and is inverted by amplifier 16 which sets flip-flop 18, which releases flip-flops 20, 22, 24 and 26 so that $C_p$ pulses entering flip-flop 20 can be counted on their trailing edges. Eventually, flip-flop 24 becomes true, setting flip-flop 26. However, gate 28 remains false until flip-flop 24 again becomes false, at which time flip-flop 18 is reset and flip-flop 38 is set, releasing flip-flops 30, 32, 34 and 36 so that they may count the trailing edges of $C_p$ pulses. Additionally, the output of flip-flop 38 enable gate 74 so that any true levels from amplifier 16 can be passed by gate 74. Eventually, flip-flop 34 becomes true, setting flip-flop 36. However, gate 40 remains false until flip-flop 34 becomes false and flip-flop 32 becomes true, at which time flip-flop 38 is reset and flip-flop 54 is set. The outputs of flip-flop 54 and gate 74 are combined by gate 58 to hold flip-flops 42, 44, 46, 48 and 50 in a reset condition. Assuming gate 74 to be false when flip-flop 54 is set, gate 58 becomes false so that flip-flops 42, 44, 46, 48 and 50 may count $C_p$ pulses. Eventually, the output of flip-flop 50 becomes true, setting flip-flop 52; however, gate 60 remains false until flip-flop 50 becomes false, at which time flip-flop 54 is reset, concluding operations. However, any dial pulses which are passed by gate 74, are also passed by gate 58, resetting flip-flops 42, 44, 46, 48 and 50 so that the output of flip-flop 50 is prevented from becoming true as long as there are recurring accepted dial pulses. Additionally, the first dial pulse that causes gate 74 to be true sets flip-flop 56, which had been holding flip-flops 62, 64, 66, 68 and 70 in a reset condition so that that pulse and any subsequent dial pulses which cause gate 74 to become true, and therefore gate 58 to become true, are counted on their trailing edges by flip-flops 62, 64 and 66.

The fourth trailing edge of an accepted dial pulse causes flip-flop 66 to become true, setting flip-flop 68. However, AND gate 72 remains false until such time as flip-flop 66 again becomes false and flip-flop 62 becomes true, which would represent the receipt of a tenth dial pulse. Since nine dial pulses is the maximum to be accepted (because one dial pulse is always deleted), that means that there are in actuality only eight numbers that can exist in each digit. The extra dial pulse causes gate 72 to become true, setting flip-flop 70, which inhibits gates 90 and 92 so that there can be no output until a new and correct number is dialed.

Flip-flops 42 and 44 represent a digital frequency divide-by-4 counter such that gate 76 passes only every fourth $C_p$ pulse, assuming that flip-flops 42 and 44 have not been reset by an accepted dial pulse from gate 74. Gates 78 and 88 together combine the outputs of flip-flops 46, 48 and 50, such that gate 88 is true only during the last twelve $C_p$ pulses before flip-flops 54 and 56 are reset. Thus, the last three pulses from gate 76 are passed by gate 90 when it is enabled by the true state of gate 88 if flip-flop 70 has not been set.

Gates 80, 82 and 84 sequentially sample flip-flops 62, 64 and 66, and are combined by gate 86. Thus, if flip-flop 62 is true during the first four of the last twelve pulses of the third counter, then gate 80 will be true during that time only. Similarly, during the second four pulses of the last twelve pulses, gate 82 will be true if flip-flop 64 is true; and similarly, gate 84 will be true during the last four pulses if flip-flop 66 is true. Gate 86 will be true any time that gates 80, 82 or 84 are true. The output of gate 92 will assume the same state as the output of gate 86 during the last twelve pulses, since gate 88 is true, assuming that flip-flop 70 has not been set.

As indicated above, although the pulses used as an illustration in the above description are telephone dial pulses, they may equally as well be radar or any other similar type pulses.

The invention claimed is:

1. A filter-type pulse counter system which separates pulses of a predetermined frequency from other pulses transmitted from a source of said pulses, filters out said other pulses, and then accepts and counts those pulses of said predetermined frequency which occur during a predetermined time interval, said counter system comprising first and second pulse counters arranged in cascade to receive signal pulses from a source thereof, a source of clock pulses connected to said cascaded pulse counters to apply clock pulses thereto, said cascaded pulse counters being enabled by said signal pulses to count said clock pulses, an acceptance gate connected to and controlled by said cascaded counters and to said source of signal pulses, said acceptance gate being adapted to accept only those signal pulses where the duration between the start of each successive pulse lies beteeen predetermined limits as determined by the cascaded counter, and a third counter connected to said acceptance gate to receive and count the accepted signal pulses.

2. The system of claim 1 wherein a fourth counter is connected to said acceptance gate and wherein each accepted signal pulse resets the fourth counter until the last of a series of accepted pulses is reached, at which time said fourth counter is not reset by any succeeding pulses and counts to conclusion.

3. The system of claim 1, wherein a fourth counter is connected to said acceptance gate, said fourth counter being reset by each accepted signal pulse, said fourth counter also being connected to said source of lock pulses to count said clock pulses, and a second gate connected between said acceptance gate and said third counter, said second gate being actuated by said fourth counter to terminate the counting of said third counter when said fourth counter reaches a predetermined count of clock pulses.

4. The system of claim 3 wherein additional gates which are connected to both said third and fourth counters are adapted to pass the count stored in said third counter to a sink when said fourth counter reaches said predetermined count.

5. The system of claim 4 wherein the count that is stored in said third counter is passed to said sink bit serially.

6. The system of claim 1 wherein the first of said signal pulses is filtered out by said first and second counters to avoid detection of random noise.

* * * * *